US006984859B2

(12) United States Patent
Ashida

(10) Patent No.: US 6,984,859 B2
(45) Date of Patent: Jan. 10, 2006

(54) SEMICONDUCTOR MEMORY DEVICE WITH STATIC MEMORY CELLS

(75) Inventor: Motoi Ashida, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 72 days.

(21) Appl. No.: 10/801,657

(22) Filed: Mar. 17, 2004

(65) Prior Publication Data

US 2004/0222451 A1 Nov. 11, 2004

(30) Foreign Application Priority Data

May 8, 2003 (JP) ............................. 2003-130244
Dec. 15, 2003 (JP) ............................. 2003-416835

(51) Int. Cl.
*H01L 27/108* (2006.01)

(52) U.S. Cl. ...................... 257/296; 257/208; 257/315; 257/393; 257/903; 257/904; 438/210

(58) Field of Classification Search ................ 257/208, 257/296, 315, 393, 903, 904; 438/210
See application file for complete search history.

(56) References Cited

U.S. PATENT DOCUMENTS 5,404,030 A * 4/1995 Kim et al. .................... 257/67
5,818,080 A * 10/1998 Kuriyama ................... 257/315
5,886,375 A * 3/1999 Sun ............................ 257/296
5,952,678 A * 9/1999 Ashida ........................ 257/67
6,380,592 B2 * 4/2002 Tooher et al. .............. 257/369
6,483,139 B1 * 11/2002 Arimoto et al. ............ 257/296

FOREIGN PATENT DOCUMENTS

JP 7-57476 3/1995

* cited by examiner

*Primary Examiner*—Michael Trinh
*Assistant Examiner*—Tsz K. Chiu
(74) *Attorney, Agent, or Firm*—McDermott Will & Emery LLP

(57) ABSTRACT

An access transistor, provided between a storage node in a memory cell and a bit line is formed of a P channel MOS transistor including P type first and second impurity regions formed in an N type well and a gate electrode. Buried interconnection is formed of metal having high melting point such as tungsten and provided stacked on a driver transistor formed on a main surface of a P type well and the access transistor. A polysilicon film forming a P channel TFT as a load element is formed on the buried interconnection, which is planarized, with an interlayer insulating film interposed.

19 Claims, 10 Drawing Sheets

SEMICONDUCTOR MEMORY DEVICE WITH STATIC MEMORY CELLS

BACKGROUND OF THE INVENTION

1. Field of the Invention

The present invention relates to a semiconductor memory device and, more specifically, to a semiconductor memory device with static memory cells.

2. Description of the Background Art

An SRAM (Static Random Access Memory), which is a representative semiconductor memory device, is an RAM that does not require a refresh operation for retaining stored data. A memory cell of the SRAM is structured such that a flip-flop having two inverters each formed of a load element and a driver transistor cross-coupled to each other is connected through access transistors to a bit line pair.

As a representative memory cell of the SRAM, a CMOS type memory cell has been generally known, in which the load element is formed of a P channel MOS transistor and the driver transistor and the access transistor are formed of N channel MOS transistors. The CMOS type memory cell has small current consumption, and because of the characteristics particular to CMOS, has superior static noise margin (hereinafter also referred to as SNM) and superior soft error immunity.

As other representative memory cells of the SRAM, a high-resistance load type memory cell in which the load element is formed of a high resistance element of polysilicon, and a P channel TFT load type memory cell in which the load element is formed of a P channel thin film transistor (hereinafter also referred to as a P channel TFT) of polysilicon are also known. The high resistance load type memory cell and the P channel TFT load type memory cell have four bulk transistors per one memory cell, and therefore, these are advantageous in that the cell area can be made smaller than the CMOS type memory cell that includes six bulk transistors.

Here, "bulk transistor" refers to a transistor formed in a silicon substrate, as opposed to a thin film element formed on the substrate such as the P channel TFT or the resistance element formed of polysilicon.

Further, as an SRAM that meets the demand for lower voltage, Japanese Patent Laying-Open No. 7-57476 discloses an SRAM in which the access transistor is formed of a P channel MOS transistor. This makes the gate-source voltage of the access transistor equal to a power supply voltage, and hence, decrease in cell current resulting from the lower voltage can be prevented and satisfactory operation under the low voltage is ensured.

Recently, size and power consumption of electronic devices have been made smaller and smaller. Accordingly, smaller size and smaller power consumption have been required of the semiconductor devices. Power consumption is in proportion to a square of power supply voltage, and hence, it is effective to lower the power supply voltage to reduce power consumption. Thus, a semiconductor memory device having high performance that can operate satisfactorily even under a low voltage has been desired.

Here, a "low voltage" generally refers to a voltage lower than 3V, and in these days, the power supply voltage has been decreased from 3.3V that has been widely used conventionally to 2.5V and further down to 1.8V.

In view of the challenge above, in an SRAM used under a low voltage, the above described CMOS type memory cell has been employed. The reason for this is as follows. In the conventional high resistance load type memory cell and P channel TFT load type memory cell, such load elements have small current drivability, and hence, SNM is small. Therefore, operation under a low voltage is instable. On the contrary, the CMOS type memory cell has large SNM because of the CMOS characteristic, and the CMOS inverter operates stably even under a low voltage. Therefore, with the current trend of lowering the voltage, the conventional high resistance load type memory cell or P channel TFT load type memory cell described above is seldom employed, and CMOS type memory cells are dominant.

When the voltage further lowers, however, it becomes difficult even for the conventional CMOS type memory cell as described above to operate satisfactorily. Specifically, in the CMOS type memory cell, the potential of a storage node becomes lower than the power supply potential, which is a low voltage, because of the threshold voltage of the access transistor formed of the N channel MOS transistor, and it becomes impossible to turn on the driver transistor.

Here, it may be possible to lower the threshold voltage of the N channel MOS transistor. Lower threshold voltage, however, leads to an increased leakage current, and the current consumption would rather be increased.

The SRAM described in Japanese Patent Laying-Open No. 7-57476 mentioned above is considered to be a useful solution to the problem, as it does not cause potential lowering at the storage node. Recently, however, a semiconductor memory device having lower power consumption as well as smaller size to enable compact and portable electronic equipment has been strongly desired.

When the size of a semiconductor device is reduced, it naturally follows that the amount of charges stored in the memory cell decreases. Therefore, it is also important to prevent generation of a soft error that tends to occur as the semiconductor memory device is reduced in size.

SUMMARY OF THE INVENTION

The present invention was made to solve the above described problem and its object is to provide a semiconductor memory device that operates satisfactorily with low power and realizes smaller size.

Another object of the present invention is to provide a semiconductor memory device that operates satisfactorily with low power, realizes smaller size, prevents generation of a soft error and operates stably.

The present invention provides a semiconductor memory device, including: a memory cell storing data; and a word line and a pair of bit lines connected to the memory cell; wherein the memory cell includes a first inverter including a first load element and a first driving element having an N channel MOS transistor, a second inverter cross-coupled with the first inverter, including a second load element and a second driving element having another N channel MOS transistor, first and second storage nodes connected respectively to output nodes of the first and second inverters, and first and second gate elements each including a P channel MOS transistor having a gate electrode connected to the word line, for connecting the first and second storage nodes to one bit line and the other bit line of the pair of bit lines, respectively; a first metal interconnection forming the first storage node is provided stacked on the first driving element and the first gate element formed on a substrate surface; a second metal interconnection forming the second storage node is provided stacked on the second driving element and the second gate element formed on the substrate surface; and the first and second load elements are provided above the first and second metal interconnections.

Therefore, in the semiconductor memory device in accordance with the present invention, the memory cell has such a structure that the load element is implemented by a P channel TFT or a high resistance element formed of polysilicon, the access transistor is implemented by a P channel MOS transistor, and the buried interconnection forming the storage node and the load element are stacked on an upper portion of bulk transistors. Thus, the device can cope with lower voltage, and the size of the memory cell can significantly be reduced.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
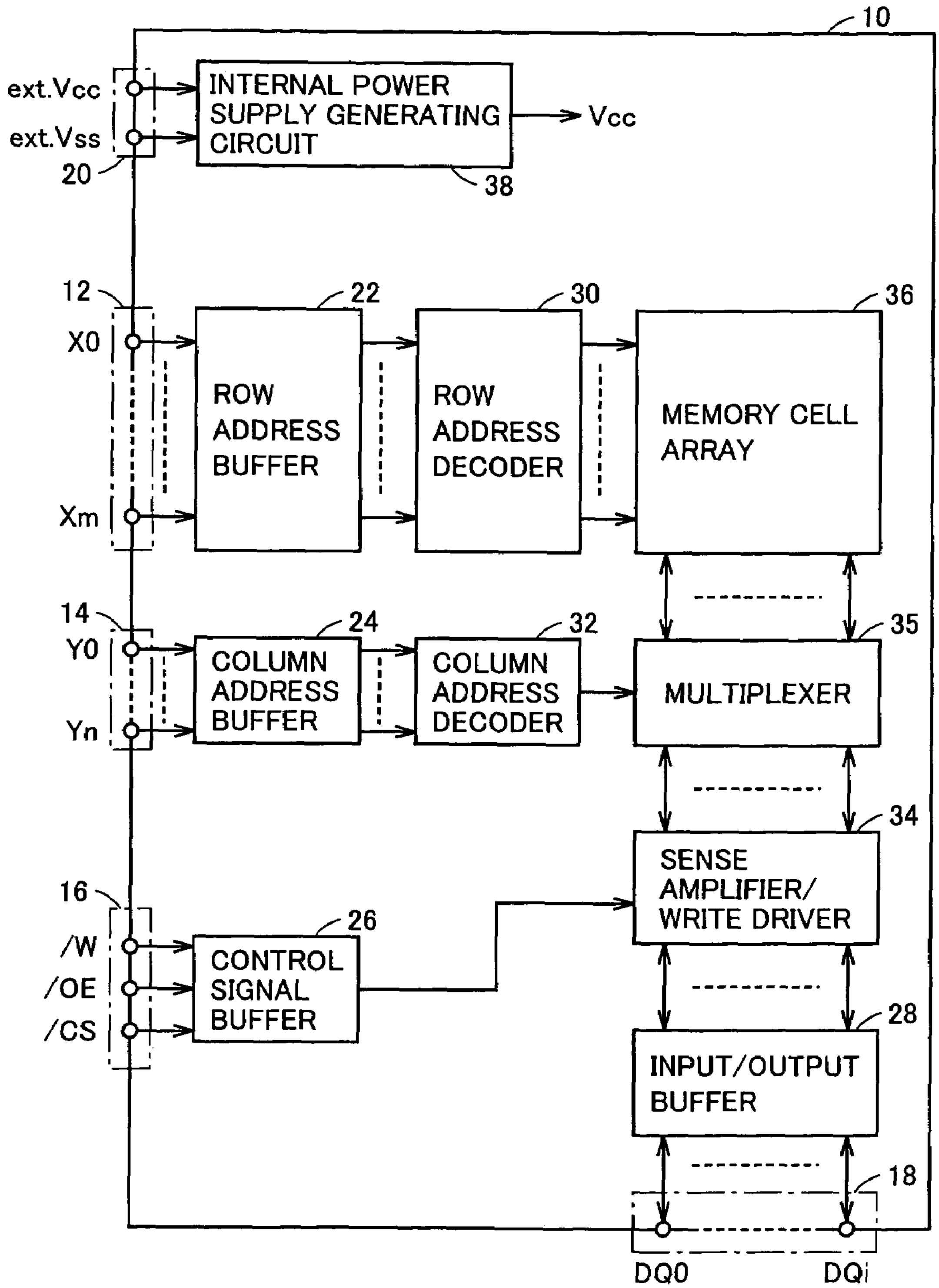
FIG. 1 is a block diagram schematically showing an overall configuration of the semiconductor memory device in accordance with the present invention.

Embodiments of the present invention will be described in detail with reference to the figures. The same or corresponding portions will be denoted by the same reference characters and description thereof will not be repeated.

First Embodiment

FIG. 1 is a block diagram schematically showing an overall configuration of the semiconductor memory device in accordance with the present invention.

Referring to FIG. 1, a semiconductor memory device 10 includes a row address terminal 12, a column address terminal 14, a control signal terminal 16, a data input/output terminal 18 and a power supply terminal 20. Semiconductor memory device 10 further includes a row address buffer 22, a column address buffer 24, a control signal buffer 26 and an input/output buffer 28. Further, semiconductor memory device 10 includes a row address decoder 30, a column address decoder 32, a sense amplifier/write driver 34, a multiplexer 35, a memory cell array 36 and an internal power supply generating circuit 38.

Row address terminal 12 and column address terminal 14 receive row address signals X0 to Xm and column address signals Y0 to Yn (m and n are natural numbers), respectively. Control signal terminal 16 receives a write control signal /W, an output enable signal /OE and a chip select signal /CS.

Row address buffer 22 takes in row address signals X0 to Xm, generates internal row address signals and outputs the same to row address decoder 30. Column address buffer takes in column address signals Y0 to Yn, generates internal column address signals and outputs the same to column address decoder 32. Control signal buffer 26 takes in write control signal /W, output enable signal /OE and chip select signal /CS, and outputs a write enable signal WE and an output enable signal OE to sense amplifier/write driver 34.

Data input/output terminal 18 is for exchanging data to be read and written in semiconductor memory device 10 with the outside, and it receives externally input data DQ0 to DQi (i is a natural number) when data is written, and externally outputs data DQ0 to DQi when data is read.

Input/output buffer 28 takes in and latches data DQ0 to DQi and outputs internal data IDQ0 to IDQi to sense amplifier/write driver 34, at the time of data writing. Input/output buffer 28 outputs internal data IDQ0 to IDQi received from sense amplifier/write driver 34 to data input/output terminal 18 at the time of data reading.

Power supply terminal 20 receives from the outside an external power supply voltage ext.Vcc and a ground voltage ext.Vss. Internal power supply generating circuit 38 receives external power supply voltage ext.Vcc and ground voltage ext.Vss from power supply terminal 20, generates a power supply voltage Vcc of a prescribed potential, and outputs the generated power supply voltage Vcc to various internal circuits in semiconductor memory device 10. Memory cells in memory cell array 36 also operate based on the power supply voltage Vcc.

In semiconductor memory device 10, power supply voltage Vcc is 1.8 V, that is, the power supply voltage is made low. As will be described later with respect to the memory cell configuration, in semiconductor memory device 10, even when the power supply voltage is so low, the memory cell operates stably, while threshold voltage of the transistors forming the memory cells is not decreased.

Row address decoder 30 selects a word line on memory cell array 36 that corresponds to the row address signals X0 to Xm. Row address decoder 30 applies the power supply voltage Vcc to a non-selected word line and applies the ground voltage GND to a selected word line. Column address decoder 32 outputs a column selection signal for selecting a bit line pair on memory cell array 36 that corresponds to the column address signals Y0 to Yn, to multiplexer 35.

At the time of data writing, sense amplifier/write driver 34 receives the write enable signal WE from control signal buffer 26, and applies, in accordance with a logic level of internal data IDQ0 to IDQi received from input/output buffer 28, the power supply voltage Vcc to one I/O line and the ground voltage GND to the other I/O line of an I/O line pair corresponding to each internal data. Further, at the time of data reading, sense amplifier/write driver 34 receives the output enable signal OE from control signal buffer 26, senses/amplifies a small voltage change generated on the I/O line pair corresponding to the read data, determines the logic level of the read data and outputs the read data to input/output buffer 28.

Multiplexer 35 connects, in accordance with the column selection signal received from column address decoder 32, the corresponding bit line pair to the I/O line pair.

Memory cell array 36 represents a group of memory elements in which a plurality of memory cells are arranged in a matrix of rows and columns, connected to row address decoder 30 through a plurality of word lines corresponding to respective rows and connected to multiplexer 35 through a plurality of bit line pairs corresponding to respective columns.

In semiconductor memory device 10, at the time of data writing, the ground voltage GND is applied by row address decoder 30 to a word line that corresponds to the row address signals X0 to Xm, and a bit line pair that corresponds to the column address signals Y0 to Yn is selected by column address decoder 32 and connected, by multiplexer 35, to the I/O line pair. Sense amplifier/write driver 34 writes the internal data IDQ0 to IDQi received from input/output buffer 28 to the I/O line pair, and thus, internal data IDQ0 to IDQi are written to the memory cell selected by the row address signals X0 to Xm and column address signals Y0 to Yn.

At the time of data reading, each bit line pair is precharged to the power supply potential Vcc, a bit line pair corresponding to the column address signals Y0 to Yn is selected by column address decoder 32, and the selected bit line pair is connected to the I/O line pair by multiplexer 35. When the ground voltage GND is applied to the word line corresponding to the row address signals X0 to Xm by row address decoder 30, data is read from the selected memory cell to the bit line pair and the I/O line pair.

Then, sense amplifier/write driver 34 senses/amplifies a small change in voltage generated on the I/O line pair corresponding to the read data, and outputs the read data to input/output buffer 28. Accordingly, internal data IDQ0 to IDQi are read from the memory cell selected by the row address signals X0 to Xm and column address signals Y0 to Yn.

Figure 2:
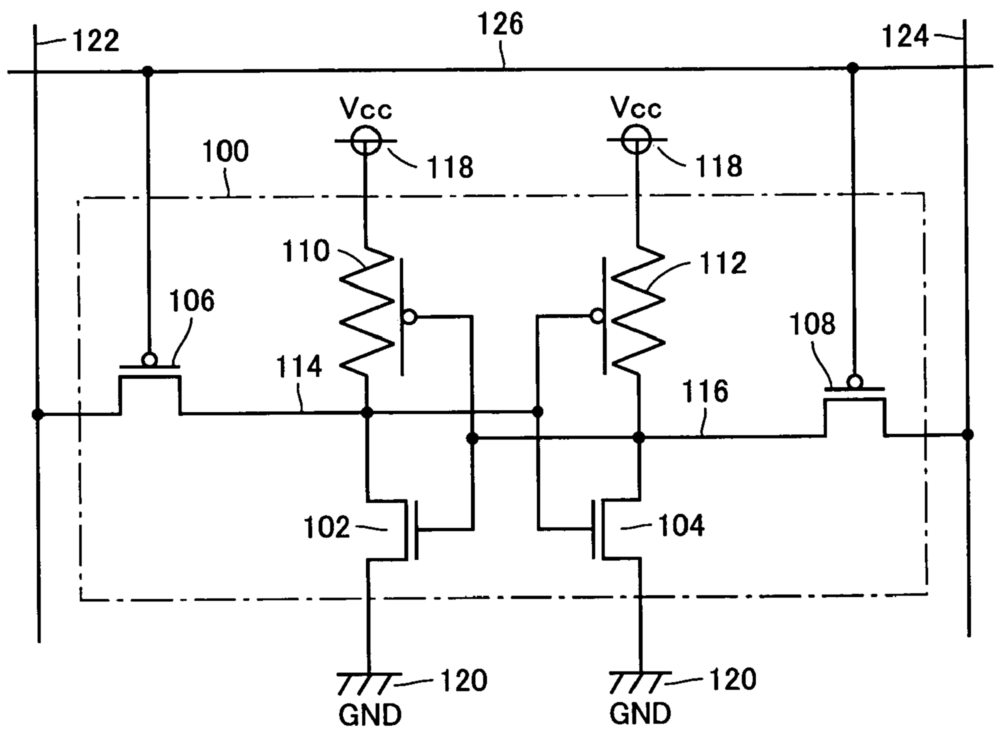
FIG. 2 is a circuit diagram showing a configuration of memory cells arranged in a matrix of rows and columns on the memory cell array shown in FIG. 1.

FIG. 2 is a circuit diagram showing a configuration of memory cells arranged in a matrix of rows and columns on the memory cell array 36 shown in FIG. 1.

Referring to FIG. 2, a memory cell 100 includes N channel MOS transistors 102, 104, P channel MOS transistors 106, 108, P channel TFTs 110, 112 and storage nodes 114, 116.

P channel TFT 110 is connected between a power supply node 118 to which the power supply voltage Vcc is applied and storage node 114, with its gate connected to storage node 116. P channel TFT 112 is connected between power supply node 118 and storage node 116, with its gate connected to storage node 114.

P channel TFTs 110 and 112 are resistance elements formed of polysilicon and having a switching function, specifically, a high resistance element with an off resistance in the order of T (terra, "T" represents $10^{12}$) Ω and an on resistance in the order of G (giga, "G" represents $10^{9}$) Ω.

N channel MOS transistor 102 is connected between storage node 114 and a ground node 120 to which the ground voltage GND is applied, with its gate connected to storage node 116. N channel MOS transistor 104 is connected between storage node 116 and ground node 120, with its gate connected to storage node 114.

N channel MOS transistors 102 and 104 are driver transistors drawing out charges from storage nodes 114 and 116, respectively. N channel MOS transistors 102 and 104 constitute the "first driving element" and the "second driving element," respectively.

P channel TFT 110 and N channel MOS transistor 102, and P channel TFT 112 and N channel MOS transistor 104 constitute inverters, respectively, and by a cross-coupling of these inverters, a flip-flop is formed. Thus, complementary data are latched in a bi-stable state at storage nodes 114 and 116, and data is stored in memory cell 100.

P channel MOS transistor 106 is connected between bit line 122 and storage node 114, with its gate connected to a word line 126. P channel MOS transistor 108 is connected between a bit line 124 that is complementary to bit line 122 and storage node 116, with its gate connected to word line 126.

P channel MOS transistors 106 and 108 are access transistors that connect memory cell 100 to the pair of bit lines 122 and 124 when the ground voltage GND is applied to word line 126. P channel MOS transistors 106 and 108 constitute the "first gate element" and the "second gate element," respectively.

An operation of memory cell 100 will be described in the following.

(1) Reading Operation

A reading operation when data "1" has been written in memory cell 100, that is, when the potentials at storage nodes 114 and 116 correspond to "H (logic high)" level and "L (logic low)" level, respectively, will be described.

Prior to the reading operation, bit lines 122 and 124 are precharged to the power supply potential Vcc. Thereafter, word line 126 is selected, and when the ground voltage GND is applied to word line 126, P channel MOS transistors 106 and 108 as access transistors turn on. Then, charges flow from bit line 124 through N channel MOS transistor 108 to storage node 116, and the charges thus flown are discharged through N channel MOS transistor 104. Consequently, a potential change occurs at bit line 124, which change is detected by a sense amplifier, not shown, and thus the data "1" stored in memory cell 100 is read.

Here, in memory cell 100, load elements are implemented by P channel TFTs 110 and 112, and TFTs are considerably inferior in current drivability to a bulk transistor. Therefore, in a data reading operation, the load elements hardly operate, and in the operation characteristics of memory cell 100, characteristics of the CMOS inverter formed of the access transistor and the driver transistor are dominant.

Figure 3:
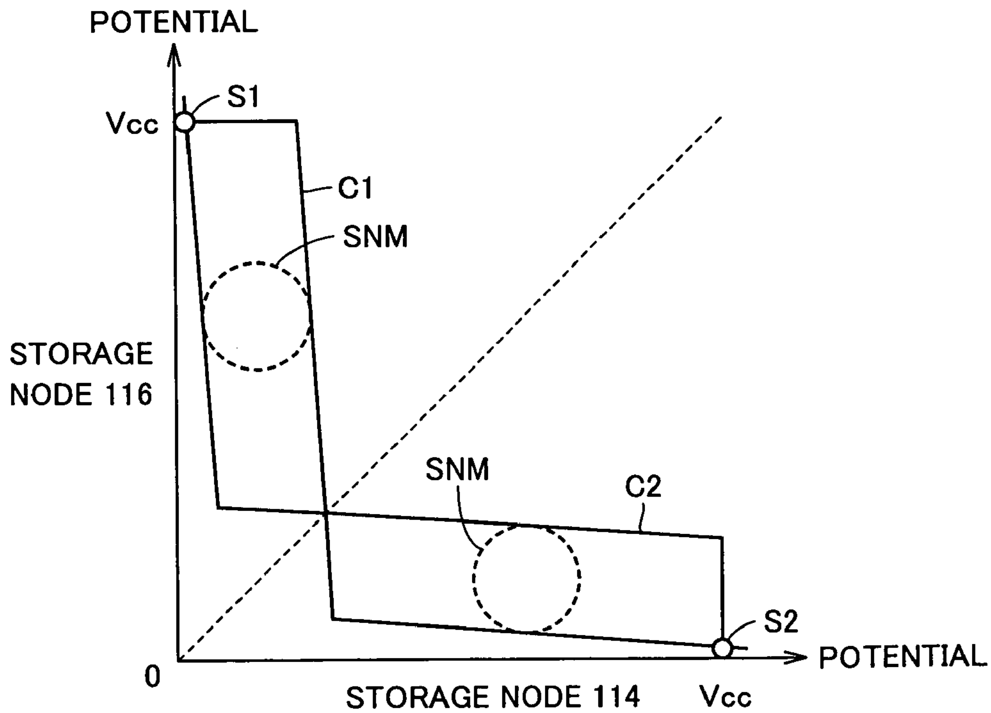
FIG. 3 represents SNM characteristic when data is read from the memory cell shown in FIG. 2.

FIG. 3 represents SNM characteristic when data is read from memory cell 100 shown in FIG. 2.

Referring to FIG. 3, the abscissa and the ordinate represent voltages at storage nodes 114 and 116, respectively, and points S1 and S2 represent stable points. A curve C1 represents transfer characteristic of an inverter formed of P channel MOS transistor 108 as the access transistor and N channel MOS transistor 104 as the driver transistor, while a curve C2 represents transfer characteristic of an inverter formed of P channel MOS transistor 106 as the access transistor and N channel MOS transistor 102 as the driver transistor.

In memory cell 100, the access transistor is formed of a P channel MOS transistor, and hence, at the time of data reading, a CMOS inverter is formed by the access transistor and the driver transistor. Therefore, even when the power supply voltage Vcc is low, sufficient SNM (the margin is represented by the size of a circle formed inside the curves C1 and C2) is ensured, and a stable data reading operation is realized.

Figure 4:
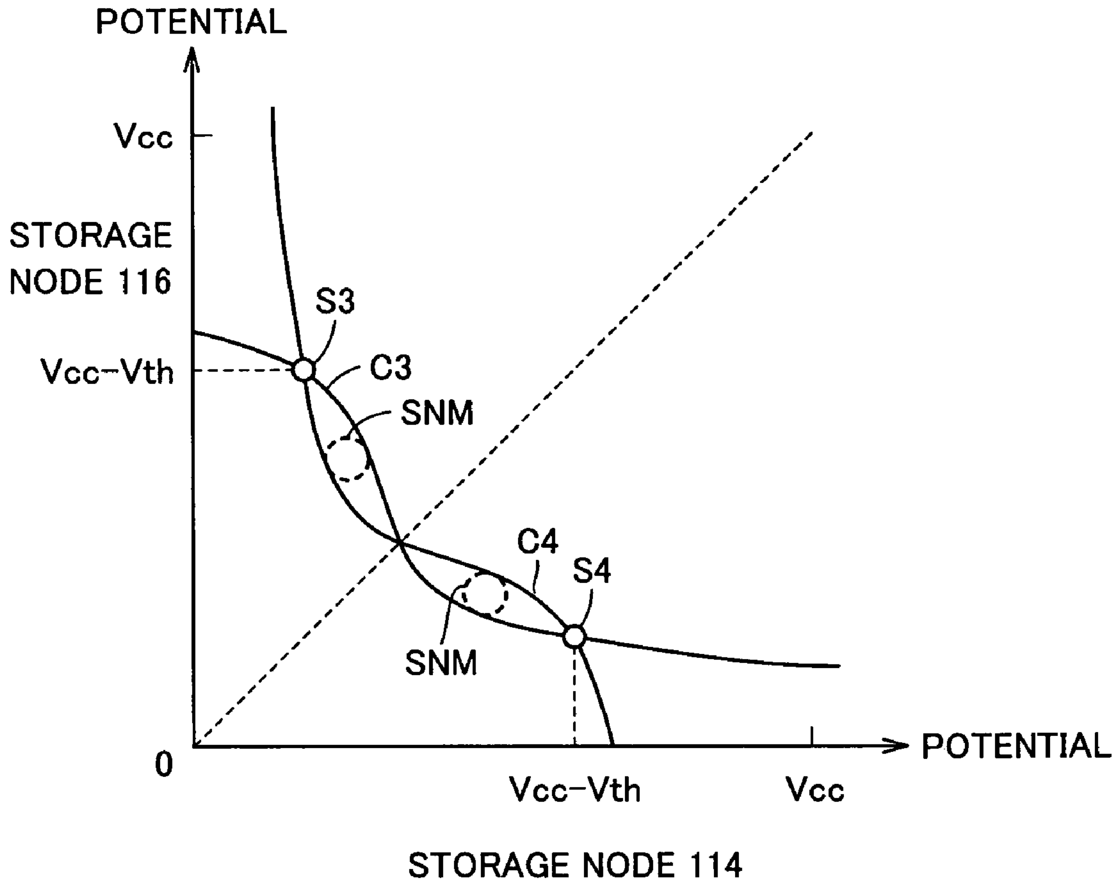
FIG. 4 represents SNM characteristic when data is read from the memory cell, with the access transistor implemented by an N channel MOS transistor.

FIG. 4 represents SNM characteristic when data is read from the memory cell, with the access transistor implemented by an N channel MOS transistor.

Referring to FIG. 4, the abscissa and the ordinate represent voltages at storage nodes 114 and 116, and points S3 and S4 represent stable points. Curves C3 and C4 represent transfer characteristics of respective inverters each formed of an access transistor and a driver transistor. In the memory cell, at the time of data reading, an E—E inverter is formed by the access transistor and the driver transistor. As to the operation characteristic of the memory cell at the time of data reading, operation characteristic of the E—E inverter is dominant.

Accordingly, stable points S3 and S4 assume values lower than the power supply voltage Vcc by the threshold voltage Vth of the N channel MOS transistor. Particularly when the power supply voltage Vcc becomes low, the SNM margin becomes extremely small, making a stable data reading operation impossible.

In the example described above, data "1" is stored in memory cell 100. The operation is similar when data "0" is stored.

(2) Writing Operation

Again referring to FIG. 2, when data "0" is to be written to memory cell 100, that is, when the potentials at storage nodes 114 and 116 are set to "L level" and "H level," respectively, will be described.

When the ground voltage GND is applied to word line 126 by a word line driver (not shown), P channel MOS transistors 106 and 108 are on and the ground voltage GND and the power supply voltage Vcc are respectively applied by sense amplifier/write driver 34 (not shown) to bit lines 122 and 124, charges are supplied from bit line 124 through P channel MOS transistor 108 to storage node 116. From storage node 114, charges are discharged through N channel MOS transistor 106 to bit line 122, and thus the state of the flip-flop formed by P channel TFTs 110, 112 and N channel MOS transistors 102, 104 is set.

In the example described above, data "0" is written to memory cell 100. The operation is similar when data "1" is written.

The structure of memory cell 100 shown in FIG. 2 will be described. P channel TFTs 110 and 112 serving as load elements are formed above N channel MOS transistors 102, 104 and P channel MOS transistors 106, 108 as bulk transistors. Thus, in memory cell 100, not only a lower voltage but also a small size can be realized.

Figure 5:
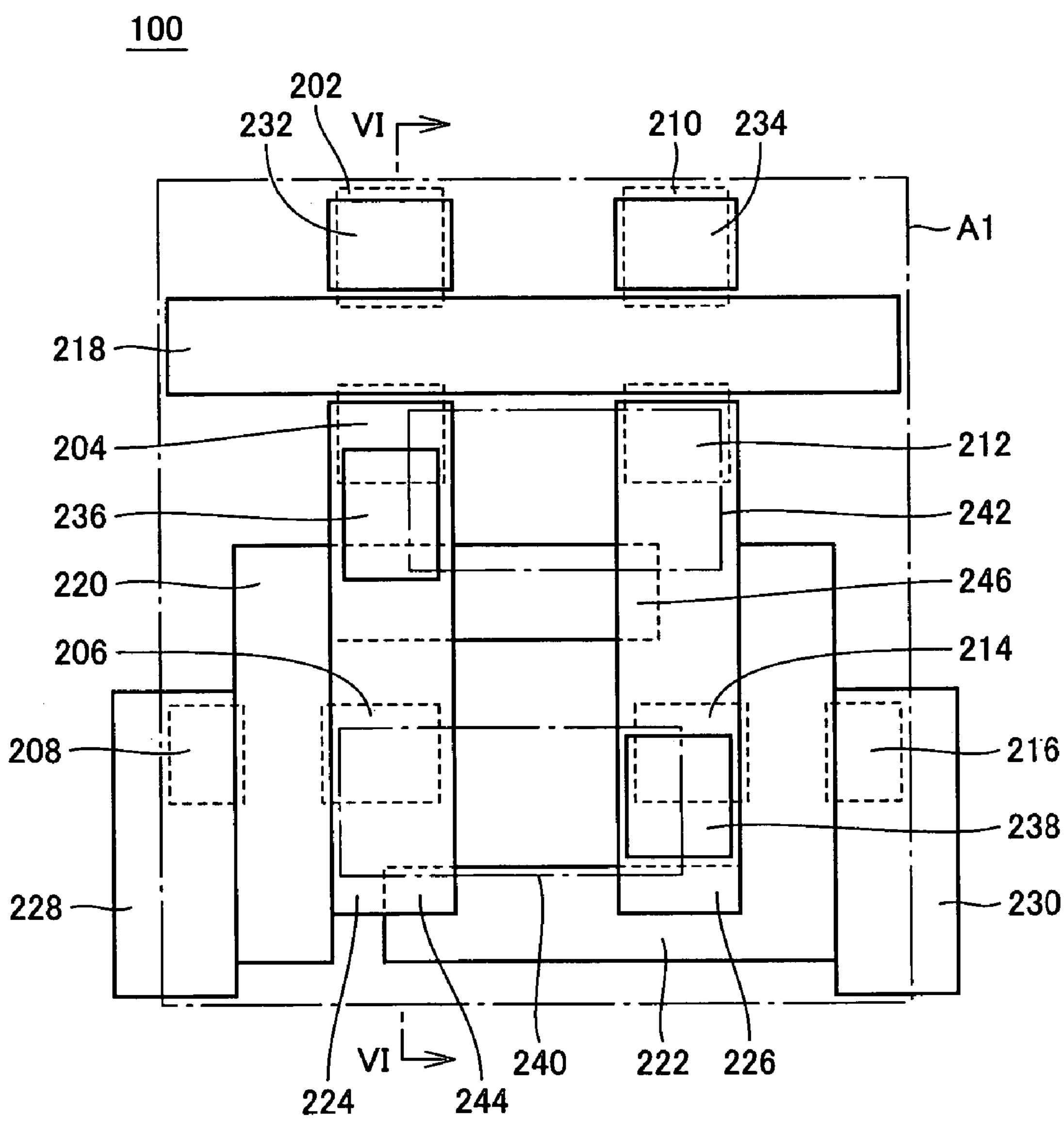
FIG. 5 is a plan view showing a structure of the memory cell shown in FIG. 2.

FIG. 5 is a plan view showing a structure of memory cell 100 shown in FIG. 2.

Referring to FIG. 5, memory cell 100 includes impurity regions 202 to 216 represented by dotted lines, a gate electrode 218, L-shaped gate electrodes 220, 222, buried interconnections 224 to 230, bit line contact portions 232, 234 represented by solid lines, connection openings 236, 238 represented by solid lines, and TFT gate portions 240, 242 represented by chain-dotted lines. As will be described with reference to cross sections later, a polysilicon layer (source/drain portion) as a component of the TFT is formed between TFT gate portion 240 and buried interconnection 224. For simplicity of description, it is omitted in the drawing.

Impurity regions 202 and 210 are connected to bit line contact portions 232 and 234, respectively. Impurity regions 204 and 206 are connected to buried interconnection 224, and impurity regions 212 and 214 are connected to buried interconnection 226. Impurity regions 208 and 216 are connected to buried interconnections 228 and 230, respectively.

Buried interconnections 224 and 226 are formed of metal having high melting point that can withstand heat processing at a high temperature when polysilicon film is formed, as will be described later. Buried interconnection 224 is connected through connection opening 236 to P channel TFT 110, not shown, and further to TFT gate portion 242 that serves as the gate of P channel TFT 112. Buried interconnection 226 is connected through connection opening 238 to P channel TFT 112, not shown, and further to TFT gate portion 240 that serves as the gate of P channel TFT 110. Above the layer in which P channel TFTs 110 and 112 including TFT gate portions 240 and 242 are formed, bit lines 122 and 124, not shown, connected to bit line contact portions 232 and 234, respectively, are formed.

Connection openings 236 and 238 constitute the "first connecting portion" and the "second connecting portion."

At region 244 where buried interconnection 224 and gate electrode 222 overlap with each other, buried interconnection 224 and gate electrode 222 are electrically connected. Specifically, the gate electrode is surrounded by an insulator, but in region 244, the insulator around gate electrode 222 is removed and buried interconnection 224 is directly joined to gate electrode 222. Similarly, at a region 246 where buried interconnection 226 and gate electrode 220 overlap with each other, buried interconnection 226 and gate electrode 220 are electrically connected.

Further, buried interconnection 224 is insulated from gate electrodes 218 and 220 by an insulator provided around gate electrodes 218 and 220. Further, buried interconnection 226 is insulated from gate electrodes 218, 222 by an insulator provided around gate electrodes 218 and 222. Buried interconnections 224 and 226 will be storage nodes 114, 116, respectively.

Impurity regions 202, 204, 210 and 212 are P type impurity regions provided in an N type well formed on the semiconductor substrate. Impurity regions 202, 204 and gate electrode 218 constitute P channel MOS transistor 106 as an access transistor. Impurity regions 210, 212 and gate electrode 218 constitute P channel MOS transistor 108 as an access transistor.

Impurity regions 206, 208, 214 and 216 are N type impurity regions provided in a P type well formed on the semiconductor substrate. Impurity regions 206, 208 and gate electrode 220 constitute N channel MOS transistor 102 as a driver transistor. Impurity regions 214, 216 and gate electrode 222 constitute N channel MOS transistor 104 as a driver transistor.

The area A1 defined by a chain-dotted line represents the area of memory cell 100.

Figure 6:
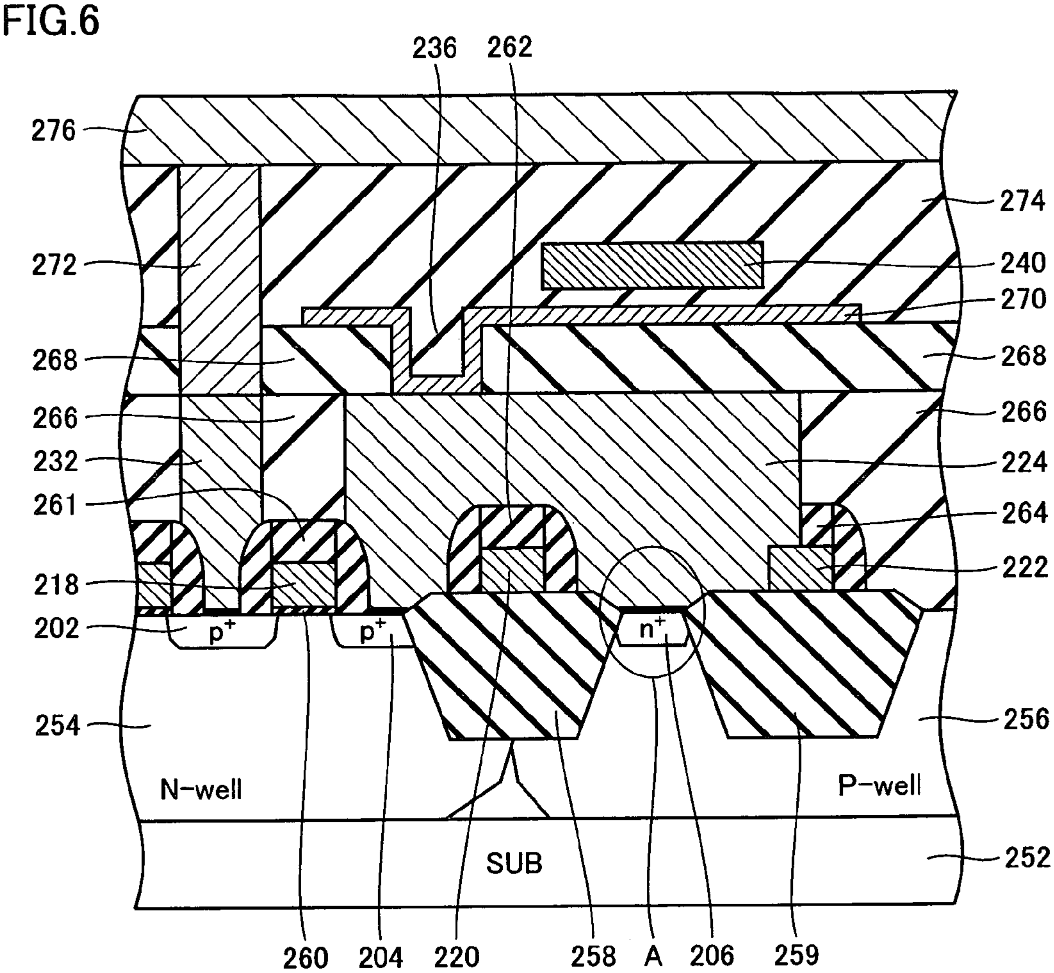
FIG. 6 is a cross section showing the structure along the line VI—VI of the memory cell shown in FIG. 5.

FIG. 6 is a cross section showing the structure along the line VI—VI of memory cell 100 shown in FIG. 5.

Referring to FIG. 6, on semiconductor substrate 252, an N type well 254 and a P type well 256 are provided. In N type well 254, impurity regions 202 and 204 are formed. In P type well 256, an impurity region 206 is formed. Field oxide films 258 and 259 insulate and isolate elements formed on N type well 254 and P type well 256.

On a channel forming region between impurity regions 202 and 204, gate electrode 218 is formed with a gate oxide film 260 interposed. On field oxide films 258 and 259, gate electrodes 220 and 222 are formed, respectively. Gate electrodes 218 to 222 are formed, for example, of polysilicon or tungsten silicide (WSi) that can withstand high temperature processing.

Gate electrodes 218 and 220 are surrounded by insulators 261 and 262, respectively, and gate electrode 222 is surrounded by an insulator 264 except for the portion to be joined with buried interconnection 224. Here, the portion at which gate electrode 222 is joined with buried interconnection 224 corresponds to the region 244 shown in FIG. 5.

Buried interconnection 224 to be storage node 114 is provided over impurity region 204, gate electrode 220 covered by insulator 262, impurity region 206 and gate electrode 222. More specifically, a thick insulator 266 that will be higher than insulators 262 and 264 is deposited on each of the impurity regions and the gate electrodes, and a trench for forming buried interconnection 224 is formed in insulator 266. Conductive metal is buried in the trench.

Here, the metal forming buried interconnection 224 is metal having lower resistance than the material of the gate electrode mentioned above and having high melting point that will not bear any thermal history when a polysilicon film 270, which will be described later, is formed above the buried interconnection 224.

The reason why metal is used for buried interconnection 224 is to electrically connect transistors having different polarities. Further, buried interconnection 224 is made considerably thick in order to reduce wiring resistance of buried interconnection 224 so as to suppress voltage drop.

The reason why metal having high melting point is used for buried interconnection 224 is as follows. On buried interconnection 224, polysilicon film 270 is formed with an interlayer insulating film 268 interposed. Here, polysilicon film 270 is generally formed by reduced pressure CVD (Chemical Vapor Deposition) process, in which high temperature processing at about 600° C. takes place. Therefore, it is necessary to use metal having high melting point that has sufficient heat resistance to withstand this processing temperature.

Suitable metal having low resistance and high melting point to be used for buried interconnection 224 may be tungsten.

Polysilicon film 270 formed on buried interconnection 224 with interlayer insulating film 268 interposed is connected to buried interconnection 224 through a connection opening 236. Further on polysilicon film 270, a TFT gate portion 240 is formed with an insulating film interposed, and by polysilicon film 270 and TFT gate portion 240, P channel TFT 110 is formed.

On polysilicon film 270 and TFT gate portion 240, a metal interconnection 276 to be bit line 122 is formed with an interlayer insulating film 274 interposed, and metal interconnection 276 is connected to impurity region 202 through bit line contact portions 272, 232. Other portions of the same layer as buried interconnection 224 and bit line contact portion 232 are formed of an insulator 266.

As described above, memory cell 100 has such a structure that a buried interconnection layer to be a storage node is formed above a bulk transistor formed on the well, and a P channel TFT as a load element is further stacked thereon. Thus, the two-dimensional occupation area of memory cell 100 (area A1 shown in FIG. 5) can be reduced.

Figure 7:
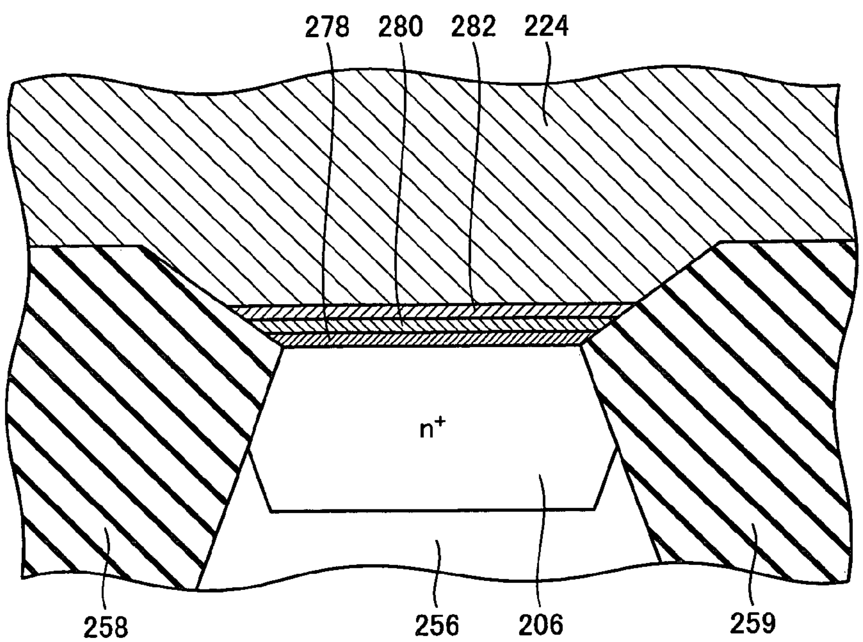
FIG. 7 is an enlarged view of portion A shown in FIG. 6.

FIG. 7 is an enlarged view of portion A shown in FIG. 6.

Referring to FIG. 7, at a contact portion between buried interconnection 224 and impurity region 206, a first silicon alloy layer 278, a second silicon alloy layer 280 and a barrier metal layer 282 are deposited successively on impurity region 206, and buried interconnection 224 is provided on barrier metal layer 282.

The first silicon alloy layer 278 is provided for preventing a junction failure caused by alloy spike. Here, alloy spike refers to a phenomenon that metal enters impurity region 206 and reaches as far as P type well 256. resulting in a short-circuit between impurity region 206 and P type well 256. Generation of alloy spike causes a junction failure between impurity region 206 and P type well 256. The first silicon alloy layer 278 is formed of a silicon alloy that has higher heat resistance than second silicon alloy layer 280 and has diffusion coefficient in impurity region 206 smaller than second silicon alloy layer 280. The first silicon alloy layer 278 is formed, by way of example, of cobalt silicide (CoSi) or nickel silicide (NiSi).

The second silicon alloy layer 280 is formed of an ohmic contact material forming an ohmic contact at the contact portion between buried interconnection 224 and impurity region 206, such as titanium silicide (TiSi). Here, ohmic contact refers to a contact of which contact resistance when the metal contacts the semiconductor is decreased to a level low enough not to influence device performance.

Barrier metal layer 282 is provided for protecting the underlying second silicon alloy layer 280 and/or first silicon alloy layer 278 when buried interconnection 224 is formed, and it is formed, for example, of titanium nitride (TiN).

In the foregoing, the first silicon alloy layer 278 constitutes a "first barrier layer," the second silicon alloy layer 280 constitutes a "connection layer" and barrier metal layer 282 constitutes a "second barrier layer."

Here, the first silicon alloy layer 278 is additionally provided below the second silicon alloy layer 280 from the following reason. In conventional high resistance load type memory cells or in P channel TFT load type memory cells, a plurality of bulk transistors formed in the semiconductor substrate are all N type transistors, and therefore, it has been unnecessary to use such metal as described above for connecting these bulk transistors, as connection by N type polysilicon has been possible.

In conventional CMOS memory cells, P type and N type bulk transistors of different polarities are formed in the semiconductor substrate, and therefore, metal is necessary for connection therebetween. In the CMOS memory cells, however, transistors forming the memory cells are all formed in the semiconductor substrate, and therefore, it is unnecessary to form a polysilicon layer to be processed at a high temperature on an upper portion.

In the first embodiment, P type and N type bulk transistors of different polarities are formed in the semiconductor substrate, a metal (buried interconnection 224) for connecting these is formed thereon, and polysilicon layer 270 to be processed at a high temperature is further formed thereon. Therefore, in the first embodiment, it is required to form a contact portion that prevents generation of alloy spike and has heat resistance to withstand processing at a high temperature. Thus, between the second silicon alloy layer 280 functioning as an ohmic contact material and impurity region 206, the first silicon alloy layer 278 having superior heat resistance and diffusion coefficient in impurity region 206 smaller than that of the second silicon alloy layer 280 is provided.

Again referring to FIG. 6, insulator 266 and buried interconnection 224 formed by burying metal in the trench provided in insulator 266 has its upper surface planarized. Specifically, upper surfaces of insulator 266 and buried interconnection 224 are processed to be flat without any recess or protrusion, through CMP (Chemical Mechanical Polishing), etch back method or the like. Here, CMP refers to a method of polishing an object surface with a grinder using a chemical containing an abrasive. The etch back method refers to a method in which the surface is made flat by utilizing viscosity of the resist film, followed by etching of the entire surface from above.

The upper surface of the underlying layer below polysilicon film 270, that is, the upper surface of the layer formed of buried interconnection 224 and insulator 266 is planarized, as electric characteristics of P channel TFT constituted by polysilicon film 270 is much influences by the flatness of the surface of the underlying layer. On the planarized surface, polysilicon film 270 is formed with interlayer insulating film 268 interposed. Therefore, according to the first embodiment, electric characteristics of the P channel TFT are stabilized.

Further, polysilicon layer 270 is provided in parallel with the underlying layer formed of buried interconnection 224 and insulator 266, and therefore, layout of contact portion 236 for connecting polysilicon film 270 with buried interconnection 224 comes to have larger degree of freedom while electric characteristics of the P channel TFT formed by polysilicon film 270 is maintained.

Though not specifically shown, at a contact portion between buried interconnection 224 and impurity region 204 and at a contact portion between bit line contact portion 232 and impurity region 202 shown in FIG. 6, the first silicon alloy layer 278, the second silicon alloy layer 280 and barrier metal layer 282 are provided, similar to the contact portion between buried interconnection 224 and impurity region 206 shown in FIG. 7.

Further, another buried interconnection 226 shown in FIG. 5 is formed of the same metal as buried interconnection 224, and the structure at the contact portion between buried interconnection 226 and the impurity region and the flatness of the upper surface of buried interconnection 226 are also the same as those shown in FIGS. 7 and 6.

Figure 8:
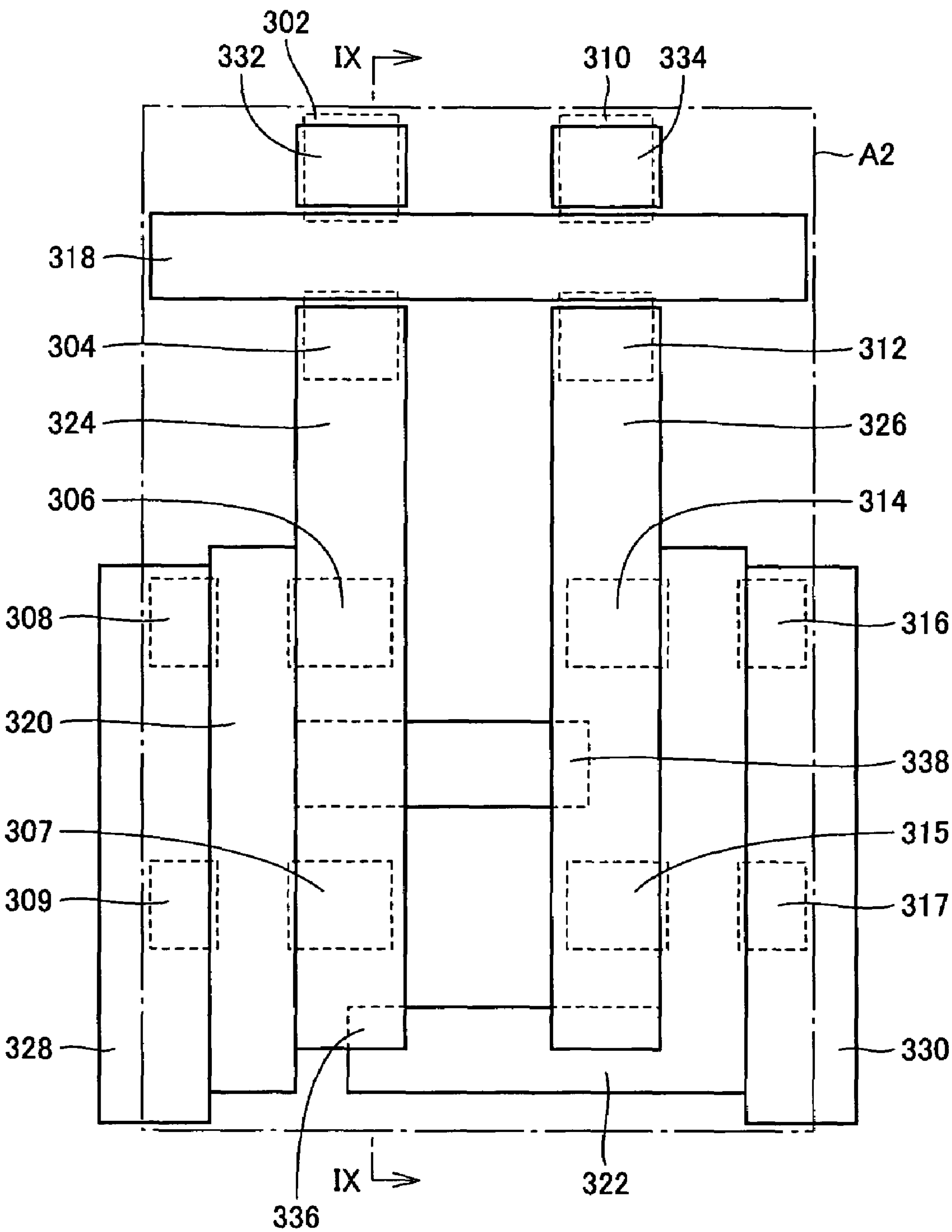
FIG. 8 is a plan view showing a structure of the memory cell in which the access transistor is implemented by an N channel MOS transistor and the load element is implemented by a P channel MOS transistor.

FIG. 8 is a plan view showing a structure of the memory cell in which the access transistor is implemented by an N channel MOS transistor and the load element is implemented by a P channel MOS transistor.

Referring to FIG. 8, the memory cell includes impurity regions 302 to 317 represented by dotted lines, a gate electrode 318, a T-shaped gate electrode 320, an L-shaped gate electrode 322, buried interconnections 324 to 330, and bit line contact portions 332, 334 represented by solid lines. A bit line pair, not shown, to be connected to bit line contact portions 332 and 334 are formed above these components.

Impurity regions 302 and 310 are connected to bit line contact portions 332 and 334, respectively. Impurity regions 304, 306 and 307 are connected to buried interconnection 324, and impurity regions 312, 314 and 315 are connected to buried interconnection 326. Further, buried interconnections 328 and 330 are connected to impurity regions 309 and 317, respectively.

At region 336 where buried interconnection 324 and gate electrode 322 overlap with each other, buried interconnection 324 and gate electrode 322 are electrically connected. Specifically, the gate electrode is surrounded by an insulator, but in region 336, the insulator around gate electrode 322 is removed and buried interconnection 324 is directly joined to gate electrode 322. Similarly, at a region 338 where buried interconnection 326 and gate electrode 320 overlap with each other, buried interconnection 326 and gate electrode 320 are electrically connected.

Further, buried interconnection 324 is insulated from gate electrodes 318 and 322 by an insulator provided around gate electrodes 318 and 320. Further, buried interconnection 326 is insulated from gate electrodes 318, 322 by an insulator provided around gate electrodes 318 and 322. Buried interconnections 324 and 326 will be storage nodes in the memory cell.

Impurity regions 302 to 306, 308, 310 to 314 and 316 are N type impurity regions provided in a P type well formed on a semiconductor substrate. Impurity regions 302, 304 and gate electrode 318, and impurity regions 310, 312 and gate electrode 318 respectively form N channel MOS transistors as access transistors. Further, impurity regions 306, 308 and gate electrode 320, and impurity regions 314, 316 and gate electrode 322 respectively form N channel MOS transistors as driver transistors.

Impurity regions 307, 309, 315 and 317 are P type impurity regions provided in an N type well formed on the semiconductor substrate. Impurity regions 307, 309 and gate electrode 320, and impurity regions 315, 317 and gate electrode 322 respectively form P channel MOS transistors as load elements.

The area A2 defined by a chain-dotted line represents the area of the memory cell.

Figure 9:
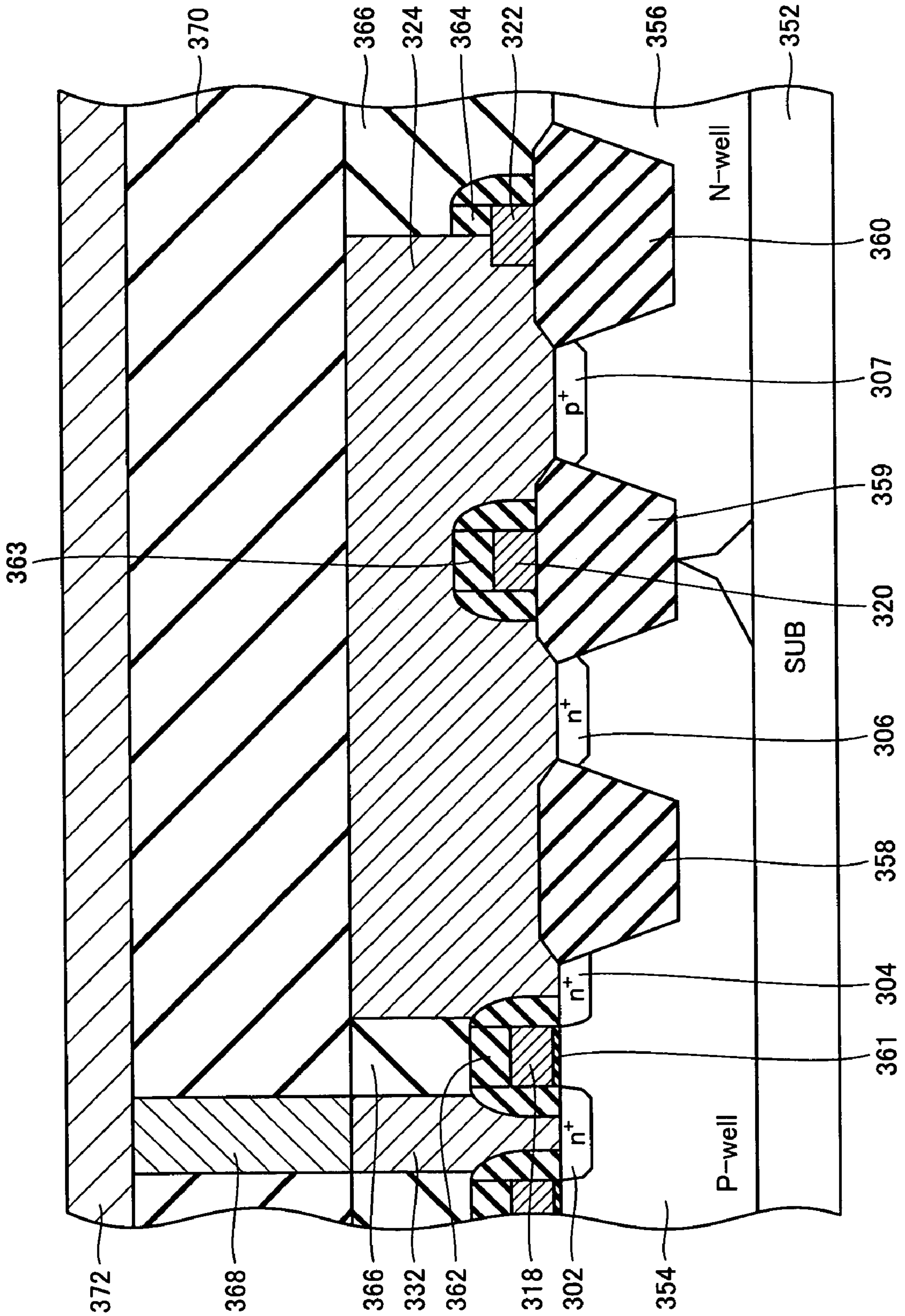
FIG. 9 is a cross section showing the structure along the line IX—IX of the memory cell shown in FIG. 8.

FIG. 9 is a cross section showing the structure along the line IX—IX of the memory cell shown in FIG. 8.

Referring to FIG. 9, on semiconductor substrate 352, a P type well 354 and an N type well 356 are formed. In P type well 354, impurity regions 302 to 306 are provided, and in N type well 356, an impurity region 307 is provided. Field oxide films 358 to 360 insulate and isolate elements formed on P type well 354 and N type well 356.

On a channel forming region between impurity regions 302 and 304, gate electrode 318 is formed with a gate oxide film 361 interposed. On field oxide films 359 and 360, gate electrodes 320 and 322 are formed, respectively. Gate electrodes 318 and 320 are surrounded by insulators 361 and 362, respectively, and gate electrode 322 is surrounded by an insulator 364 except for the portion to be joined with buried interconnection 324. Here, the portion at which gate electrode 322 is joined with buried interconnection 324 corresponds to the region 336 shown in FIG. 8.

Buried interconnection 324 to be the storage node is provided over impurity region 304, field oxide film 358, impurity region 306, gate electrode 320 covered with insulator 363, impurity region 307 and gate electrode 322. Further on buried interconnection 324, a metal interconnection 372 to be a bit line is formed with an interlayer insulating film 370 interposed, and metal interconnection 372 is connected to impurity region 302 through bit line contact portions 368 and 332. Portions of the same layer as buried interconnection 324 and bit line contact portion 332 are formed of an insulator 366.

Again referring to FIGS. 5 and 8, areas A1 and A2 representing areas of the two memory cells will be compared. Area A1 is about 0.6 times as large as area A2. Specifically, memory cell 100 in accordance with the present invention having the above described stacked structure has its area reduced by about 40% from the memory cell in which the load elements are formed of P channel MOS transistors.

Modification of the First Embodiment

Figure 10:
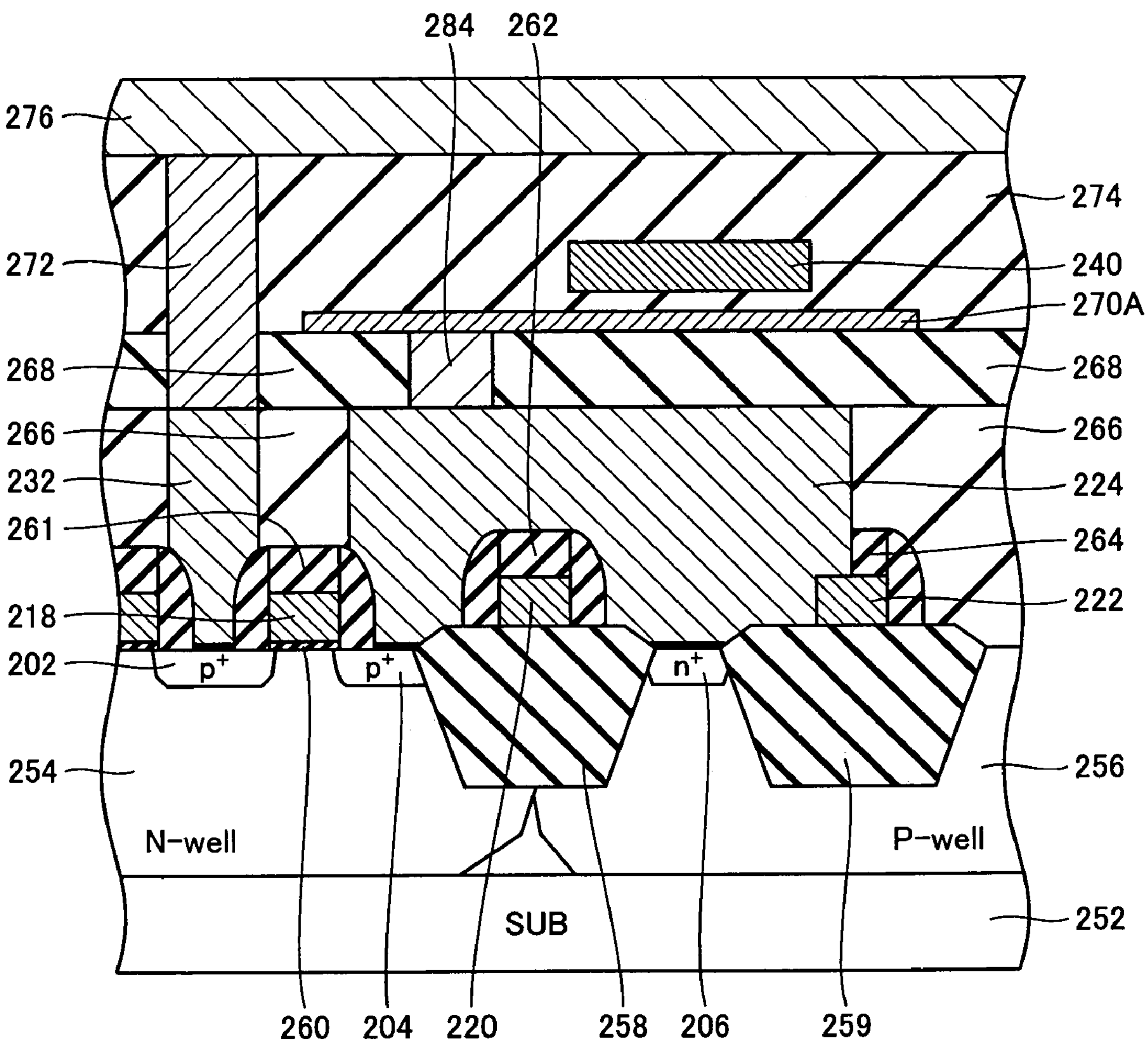
FIG. 10 is a cross section showing a modification of the memory cell shown in FIG. 6.

FIG. 10 is a cross section showing a modification of the memory cell shown in FIG. 6.

Referring to FIG. 10, the memory cell has a configuration of memory cell 100 shown in FIG. 6 with polysilicon film 270 replaced by a polysilicon film 270A and connection opening 236 replaced by another buried interconnection 284.

Buried interconnection 284 electrically connects polysilicon film 270A to buried interconnection 224. Buried interconnection 284 is also formed of metal having high melting point such as tungsten, which can withstand thermal history when polysilicon film 270A is formed.

In the modification of the first embodiment, it is unnecessary to provide a recess in the polysilicon film for forming the contact portion. Therefore, it becomes possible to make uniform the polysilicon film with higher accuracy, and hence electric characteristics of the P channel TFT formed by polysilicon film 270A can further be stabilized.

As described above, in semiconductor memory device 10 in accordance with the first embodiment or the modification thereof, the load elements and the access transistors are formed by P channel TFTs and P channel MOS transistors, respectively, and the buried interconnection to be the storage node and P channel TFTs forming the load elements are stacked on the bulk transistors. Thus, it becomes possible to cope with a lower voltage and to significantly reduce the size of memory cell 100.

Further, in semiconductor device 10, the storage node is implemented with buried interconnection of a metal having high melting point, and therefore, resistance between transistors can be maintained low, voltage drop can be suppressed, and the buried interconnection does not bear thermal history of a high temperature processing when a polysilicon film is formed on the buried interconnection.

In semiconductor device 10, the first silicon alloy layer having superior heat resistance is provided between the second silicon alloy layer functioning as an ohmic contact material and the impurity region. Therefore, even when a high temperature processing is performed for forming the polysilicon film, it is possible to prevent generation of alloy spike.

Further, in semiconductor device 10, the upper surface of the underlying layer beneath the polysilicon layer is planarized. Therefore, electric characteristics of the P channel TFT formed by the polysilicon film is stabilized and the layout pattern at the contact portion for connecting the polysilicon film to the buried interconnection comes to have higher degree of freedom.

Second Embodiment

In the second embodiment, a capacitor is formed for the storage node, in the memory cell in accordance with the first embodiment or the modification thereof. Thus, capacity of the storage node is increased, and soft error immunity is improved. Consequently, the memory cell operation becomes stable.

The overall configuration of the semiconductor memory device in accordance with the second embodiment is the same as that of semiconductor memory device 10 shown in FIG. 1, and therefore, description thereof will not be repeated.

Figure 11:
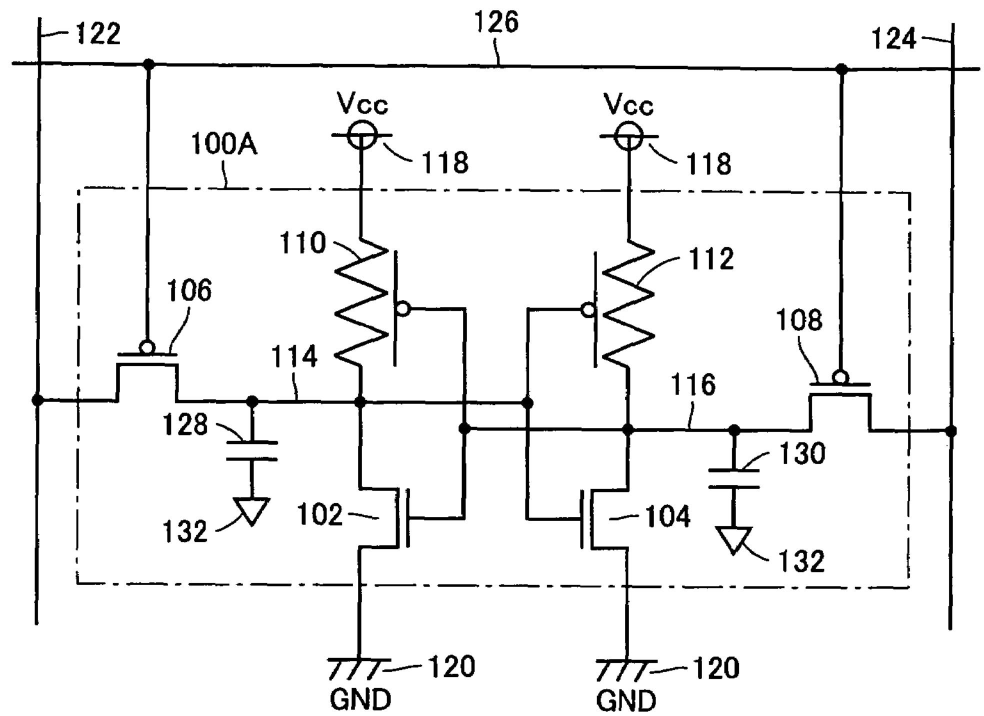
FIG. 11 is a circuit diagram showing a memory cell configuration in accordance with a second embodiment.

FIG. 11 is a circuit diagram showing a memory cell configuration in accordance with the second embodiment.

Referring to FIG. 11, a memory cell 100A includes, in addition to the configuration of memory cell 100 in accordance with the first embodiment, capacitors 128, 130 and a constant potential node 132. Capacitor 128 is connected between storage node 114 and constant potential node 132. Capacitor 130 is connected between storage node 116 and constant potential node 132. Other circuit configuration of memory cell 100A is the same as that of memory cell 100.

Capacitors 128 and 130 are formed stacked above a substrate, and connected to buried interconnections that will be storage nodes 114 and 116, through contact holes, respectively. Thus, capacity of storage nodes 114 and 116 can be increased without increasing the area of storage nodes 114 and 116. Specifically, as capacitors 128 and 130 are provided, soft error immunity of memory cell 100A can be improved without increasing the area as compared with memory cell 100, and the operation of memory cell 100A can be made stable.

As described above, in the semiconductor memory device in accordance with the second embodiment, capacity of the storage nodes is increased by connecting capacitors to the storage nodes, to prevent soft errors associated with size reduction of the device. Thus, the device is operable at a low voltage and reduced in size, and its operation becomes stable.

Third Embodiment

In the third embodiment, the load elements are implemented by resistance elements having high resistance values formed of polysilicon, in the memory cell in accordance with the first embodiment or the modification thereof.

The overall configuration of the semiconductor memory device in accordance with the third embodiment is the same as that of semiconductor memory device shown in FIG. 1, and therefore, description thereof will not be repeated.

Figure 12:
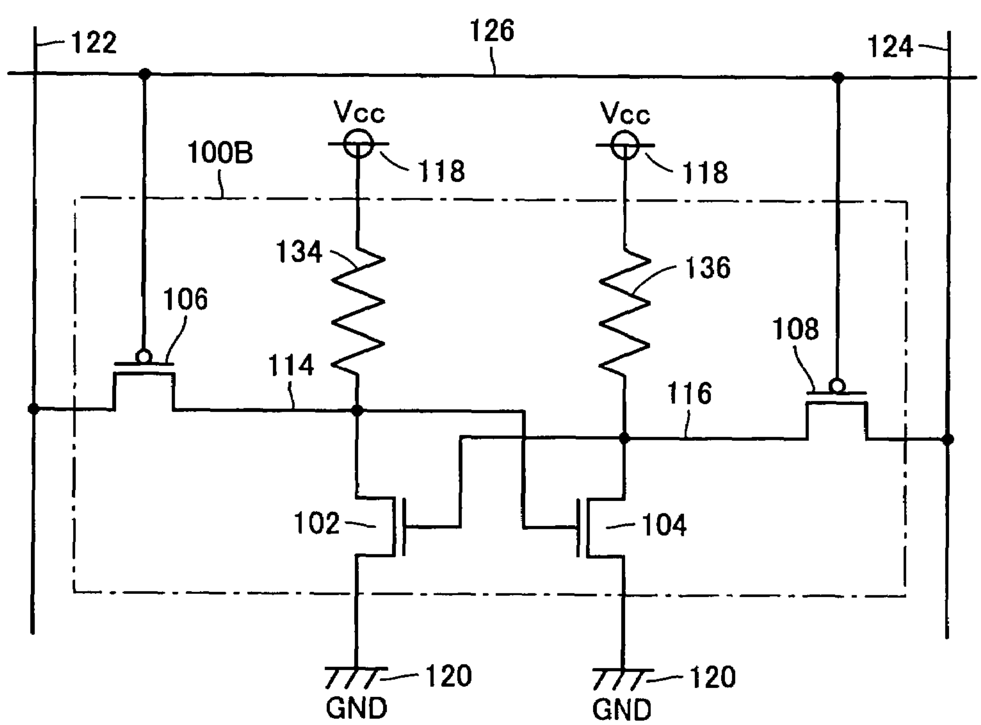
FIG. 12 is a circuit diagram showing a memory cell configuration in accordance with a third embodiment.

FIG. 12 is a circuit diagram showing a memory cell configuration in accordance with the third embodiment.

Referring to FIG. 12, a memory cell 100B has the same configuration as memory cell 100 in accordance with the first embodiment, except that high resistance elements 134, 136 each formed of polysilicon are provided in place of P channel TFTs 110 and 112. Other circuit configuration of memory cell 100B is the same as that of memory cell 100.

Similar to P channel TFTs 110 and 112 in memory cell 100, high resistance elements 134 and 136 are also formed by depositing a polysilicon film on the buried interconnections to be storage nodes 114 and 116 with an interlayer insulating film interposed. Therefore, memory cell 100B has an area comparable to that of memory cell 100 in accordance with the first embodiment, and as compared with the memory cell shown in FIG. 8, the area is reduced by about 40%.

The range of resistance values of resistance elements 134 and 136 is determined in consideration of leakage current of N channel MOS transistors 102 and 104 as driver transistors, memory capacity of the semiconductor memory device on which the memory cell 100B is mounted, specification of standby current (current consumption in the standby period) and the like.

As described above, also by the semiconductor memory device in accordance with the third embodiment, effects similar to those of the semiconductor device of the first embodiment can be attained.

Fourth Embodiment

In the fourth embodiment, a capacitor is provided for the storage node, in the memory cell in accordance with the third embodiment.

The overall configuration of the semiconductor memory device in accordance with the fourth embodiment is the same as that of semiconductor memory device shown in FIG. 1, and therefore, description thereof will not be repeated.

Figure 13:
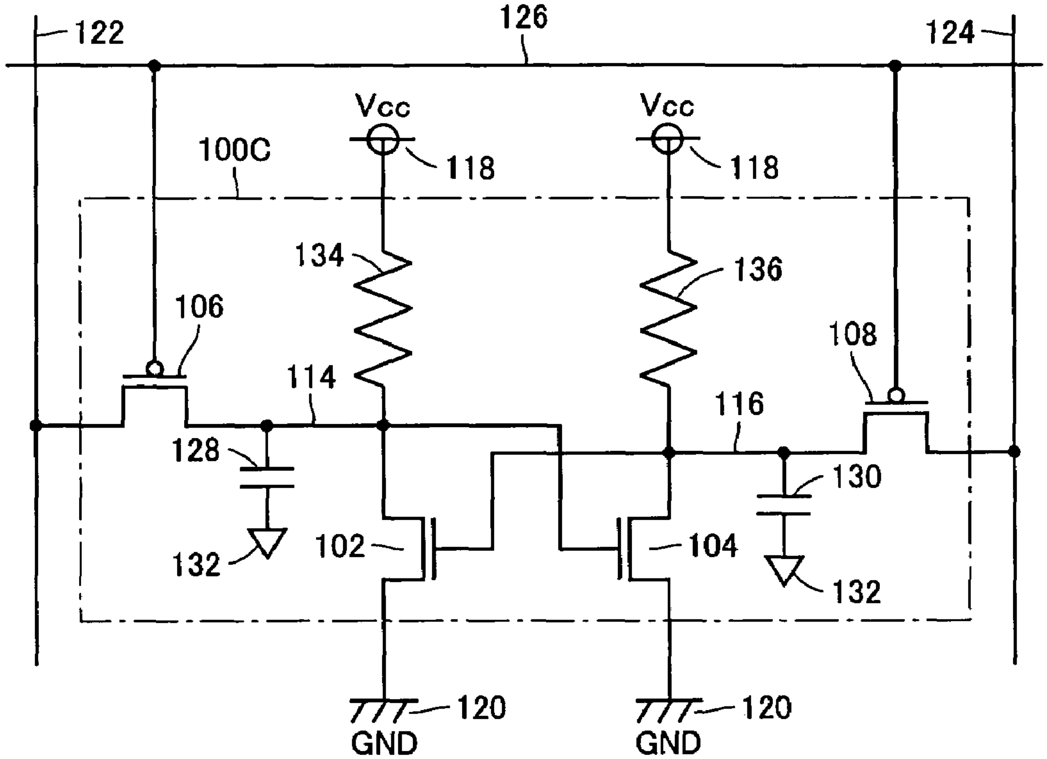
FIG. 13 is a circuit diagram showing a memory cell configuration in accordance with a fourth embodiment.

FIG. 13 is a circuit diagram showing a memory cell configuration in accordance with the fourth embodiment.

Referring to FIG. 13, a memory cell 100C includes, in addition to the configuration of memory cell 100B in accordance with the third embodiment, capacitors 128, 130 and a constant potential node 132. Capacitors 128 and 130 are described with reference to the second embodiment, and therefore, description thereof will not be repeated. Other circuit configuration of memory cell 100C is also the same as that of memory cell 100B, and hence, description thereof will not be repeated.

In the fourth embodiment also, as in the second embodiment, capacitors 128 and 130 are formed stacked above the substrate and connected to the buried interconnections to be storage nodes 114 and 116 through contact holes, respectively. Thus, capacity of storage nodes 114 and 116 can be increased without increasing the area of buried interconnections forming storage nodes 114 and 116, and soft error immunity of memory cell 100C is improved.

As described above, also by the semiconductor memory device in accordance with the fourth embodiment, effects similar to those of the semiconductor device of the second embodiment can be attained.

Though the power supply voltage Vcc generated by internal power supply generating circuit 38 was 1.8V in the embodiments above, the power supply voltage Vcc is not limited thereto. The semiconductor device in accordance with the present invention is particularly effective under a low voltage condition where the power supply voltage Vcc is lower than 3V.

In the embodiments above, semiconductor memory device 10 has been described as including internal power supply generating circuit 38 that receives external power supply voltage ext.Vcc and ground voltage ext.Vss to generate the power supply voltage Vcc of a low potential. An external voltage of a low potential may be received and directly used as the power supply voltage Vcc, without providing internal power supply generating circuit 38.

In the second and fourth embodiments above, capacity of storage nodes 114 and 116 is increased by connecting capacitors 128 and 130 to storage nodes 114 and 116, respectively. If it is structurally possible to make thicker the layer of the buried interconnections forming storage nodes 114 and 116, capacity of storage nodes 114 and 116 may be increased by increasing the thickness of the buried interconnection layer, without providing capacitors 128 and 130. In this case also, it is possible to improve soft error immunity of the memory cell and the memory cell operation can be made stable, without increasing the area as compared with memory cell 100 in accordance with the first embodiment.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:

a memory cell storing data; and a word line and a pair of bit lines connected to said memory cell; wherein said memory cell includes a first inverter including a first load element and a first driving element having an N channel MOS transistor, a second inverter cross-coupled with said first inverter, including a second load element and a second driving element having another N channel MOS transistor, first and second storage nodes connected respectively to output nodes of said first and second inverters, and first and second gate elements each including a P channel MOS transistor having a gate electrode connected to said word line, connecting said first and second storage nodes to one bit line and the other bit line of said pair of bit lines, respectively;

a first metal interconnection forming said first storage node is provided stacked on said first driving element and said first gate element formed on a substrate surface;

a second metal interconnection forming said second storage node is provided stacked on said second driving element and said second gate element formed on said substrate surface; and said first and second load elements are provided above said first and second metal interconnections.

2. The semiconductor memory device according to claim 1, wherein each of said first and second metal interconnections is formed of metal having heat resistance to processing temperature when said first and second load elements are formed.

3. The semiconductor memory device according to claim 2, wherein each of said first and second load elements includes a P channel thin film transistor.

4. The semiconductor memory device according to claim 2, wherein each of said first and second load elements includes a resistance element formed of polysilicon and having a resistance value higher than a prescribed resistance value.

5. The semiconductor memory device according to claim 2, wherein each of said first and second metal interconnections is formed of metal having lower resistance than a gate electrode material of said first and second gate elements.

6. The semiconductor memory device according to claim 5, wherein each of said first and second metal interconnections is formed of tungsten.

7. The semiconductor memory device according to claim 1, wherein said first metal interconnection connects drain electrode of said first gate element, drain electrode of said first driving element and gate electrode of said second driving element with each other;

said second metal interconnection connects drain electrode of said second gate element, drain electrode of said second driving element and gate electrode of said first driving element with each other; and said first and second load elements are formed over said first and second metal interconnections with an interlayer insulating film interposed, and connected respectively to said first and second metal interconnections through first and second connecting portions.

8. The semiconductor memory device according to claim 7, further comprising a plurality of first barrier layers provided at contact portions between said first or second metal interconnection and respective ones of said plurality of drain electrodes having heat resistance to processing temperature when said first or second load element is formed.

9. The semiconductor memory device according to claim 8, wherein each of said plurality of first barrier layers is formed of cobalt silicide or nickel silicide.

10. The semiconductor memory device according to claim 8, further comprising a plurality of connection layers provided between each of said plurality of first barrier layers and the corresponding first or second metal interconnection, forming an ohmic contact between said corresponding first or second metal layer and the corresponding drain electrode.

11. The semiconductor memory device according to claim 10, wherein each of said plurality of connection layers is formed of titanium silicide.

12. The semiconductor memory device according to claim 10, further comprising a plurality of second barrier layers provided between each of said plurality of connection layers and said corresponding first or second metal interconnection, protecting the corresponding connection layer and/or the corresponding first barrier layer when said corresponding first or second metal interconnection is formed.

13. The semiconductor memory device according to claim 12, wherein each of said plurality of second barrier layers is formed of titanium nitride.

14. The semiconductor memory device according to claim 10, wherein each of said first barrier layers has diffusion coefficient in said corresponding drain electrode smaller than the diffusion coefficient of the corresponding connection layer in said corresponding drain electrode.

15. The semiconductor memory device according to claim 7, wherein each of said first and second load elements includes a P channel thin film transistor; and planes facing said P channel thin film transistor in said first and second metal interconnections are planarized.

16. The semiconductor memory device according to claim 7, wherein each of said first and second load element includes a resistance element formed of polysilicon and having a resistance value higher than a prescribed resistance value; and planes facing said resistance element in said first and second metal interconnections are planarized.

17. The semiconductor memory device according to claim 1, further comprising:

an internal power supply generating circuit receiving an external power supply voltage and generating an internal voltage lower than a prescribed voltage; wherein said memory cell operates with said internal voltage generated by said internal power supply generating circuit.

18. The semiconductor memory device according to claim 17, wherein said prescribed voltage is 3V.

19. The semiconductor memory device according to claim 1, wherein said memory cell further includes a first capacitance element having one terminal connected to said first storage node and the other terminal connected to a node with a constant potential, and a second capacitance element having one terminal connected to said second storage node and the other terminal connected to said node with the constant potential.

* * * * *